United States Patent [19]
Sasaki et al.

[11] Patent Number: 5,614,844
[45] Date of Patent: Mar. 25, 1997

[54] HIGH SPEED PROGRAMMABLE LOGIC ARCHITECTURE

[75] Inventors: Paul T. Sasaki; Suresh M. Menon, both of Sunnyvale; Tsung C. Whang, Cupertino, all of Calif.

[73] Assignee: Dyna Logic Corporation, Sunnyvale, Calif.

[21] Appl. No.: 465,595

[22] Filed: Jun. 5, 1995

Related U.S. Application Data

[63] Continuation-in-part of Ser. No. 188,499, Jan. 27, 1994, Pat. No. 5,504,440.

[51] Int. Cl.$^6$ ............... H03K 19/082; H03K 19/0948
[52] U.S. Cl. ............... 326/84; 326/48; 326/50; 326/110
[58] Field of Search ............... 326/109–110, 126–127, 326/84, 83, 48–50; 327/544, 407–409, 411–412

[56] References Cited

U.S. PATENT DOCUMENTS

| | | | |
|---|---|---|---|
| Re. 34,363 | 8/1993 | Freeman | 326/41 |
| 4,410,816 | 10/1983 | Kanai | 326/126 |
| 4,706,216 | 11/1987 | Carter | 365/94 |
| 4,758,745 | 7/1988 | Elgamal et al. | 307/465 |
| 4,855,619 | 8/1989 | Hsieh et al. | 307/443 |
| 4,987,319 | 1/1991 | Kawana | 307/465 |
| 4,999,519 | 3/1991 | Kitsukawa et al. | 326/84 |
| 5,017,813 | 5/1991 | Galbraith et al. | 307/475 |
| 5,144,166 | 9/1992 | Camarota et al. | 307/465.1 |
| 5,155,387 | 10/1992 | Fletcher et al. | 326/48 |
| 5,208,491 | 5/1993 | Ebeling et al. | 307/465 |
| 5,256,918 | 10/1993 | Suzuki | 307/465 |
| 5,260,881 | 11/1993 | Agrawal et al. | 364/489 |
| 5,298,810 | 3/1994 | Scott et al. | 326/109 |
| 5,327,023 | 7/1994 | Kawana et al. | 307/465 |
| 5,355,035 | 10/1994 | Vora et al. | 307/494 |
| 5,369,314 | 11/1994 | Patel et al. | 326/13 |
| 5,397,937 | 3/1995 | Ueda et al. | 326/84 |
| 5,406,133 | 4/1995 | Vora | 327/108 |
| 5,497,108 | 3/1996 | Menon et al. | 326/84 |

*Primary Examiner*—Edward P. Westin
*Assistant Examiner*—Jon Santamauro
*Attorney, Agent, or Firm*—Townsend and Townsend and Crew LLP

[57] ABSTRACT

Architecture for a programmable logic device is described which can operate at substantially faster clock rates than present programmable logic devices. The PLD uses BiCMOS circuit elements to make use of the speed advantages of bipolar technology while also enjoying the limited power consumption of CMOS technology.

18 Claims, 7 Drawing Sheets

HIGH SPEED PROGRAMMABLE LOGIC ARCHITECTURE

This application is a continuation-in-part of U.S. patent application Ser. No. 08/188,499, filed Jan. 27, 1994 now U.S. Pat. No. 5,504,440.

BACKGROUND OF THE INVENTION

This invention relates to programmable logic, and in particular, to a high speed programmable logic device architecture.

A programmable logic device (PLD) is a programmable integrated circuit that allows the user of the circuit, using software control, to customize the logic functions the circuit will perform. The logic functions previously performed by small, medium and large scale integration integrated circuits are now capable of being performed by programmable logic devices. PLDs now have a capacity on the order of 50,000 gates per integrated circuit. When a typical programmable logic device is supplied by an integrated circuit manufacturer, it is not yet capable of performing any specific function. The user, however, in conjunction with software, also typically supplied by the programmable logic device manufacturer, can program the PLD to perform the specific function or functions required by the user's application. The PLD then can function in a larger system designed by the user, just as though dedicated logic chips were employed. This functionality allows the user to debug the system logic without committing the time or expense of custom chips or gate arrays. It also allows small production runs, and the customization of hardware to suit a very specific application. In some PLD's the logic can be changed "on-the-fly" enabling the PLD to perform one function at one time during system operation, and another function at a later time.

A typical PLD consists of an array of identical logic cells that can be individually programmed and arbitrarily interconnected to each other to provide internal input and output signals, thus permitting the performance of highly complex combinational and sequential logic functions. The program is implemented in the PLD by setting the states of programmable elements such as memory cells.

One type of programmable logic, known as programmable logic arrays (PLA) is a combinatorial two-level AND/OR integrated circuit which can be programmed to perform sum-of-products logic. Such devices typically consist of a series of AND gates having input terminals which can be programmably connected to chip input signals, and a series of OR gates which may be programmably connected to receive the output signals from the AND gates.

Another type of programmable logic device is known as programmable array logic (PAL). PALs use a fixed OR array and bidirectional input/output pins. A disadvantage of both PALs and PLAs is the lack of density with which they may be programmed. In other words, although the array is capable of performing many logic functions, utilization of the array is not as complete as desirable. Furthermore the size of the array increases faster than its programming capability.

A response to this problem has been the provision of "macrocells" or logic blocks in programmable logic devices. A macrocell or logic block is a small grouping of logic capable of performing many different functions, and being selectively interconnectable to other macrocells or logic blocks. This allows the logic in the programmable logic device to assume a more granular structure in which pieces of the logic communicate with other pieces, to provide an overall more efficient utilization of the integrated circuit. Herein we use the phrase "programmable logic device" to refer collectively to programmable array logic, programmable logic arrays, field programmable gate arrays, and other types of programmable logic devices.

A significant disadvantage of all programmable logic devices presently available is their relatively slow speed. In all of the programmable logic devices described above, the connections within the AND and OR arrays, as well as to and from the macrocells, are made with erasable programmable read only memory cells, electrically erasable read only memory cells, static random access memory cells, fuses, or antifuses, or the like. In each of these cases, the interconnection approach is passive. That is, the state of a memory cell or fusible connection is itself used to control some other apparatus which makes or breaks a connection between two nodes.

All of these connections are passive in the sense that the signals presented to the connection simply pass through the connection (or do not pass if the connection is open). As a result, the overall speed of the programmable logic device is limited for reasons discussed below. Even the fastest prior art large field programmable gate arrays presently available operate at 50 MHz or slower. Some small transistor-transistor logic (TTL) devices can operate at over 100 MHz. No one is presently manufacturing large fast arrays.

One of the primary reasons for the relatively slow operating speed of prior art programmable logic devices is the resistance present in the interconnection system. The interconnection system is the programmable "wiring" by which the logic signals are propagated across the integrated circuit chip. This propagation speed is limited by the series resistance of the transfer gates employed, whether formed as EPROM cells, SRAM cells, antifuses, or otherwise. As a result, manufacturers of prior art programmable logic devices have been forced to choose between resistance and capacitance in the technology selection for their transfer gates.

As PLDs are increasingly used in applications that require superior speed performance, it is would be desirable to have a PLD with programmable circuits that can operate at high speeds but that do not draw an excessive amount of power during circuit operation.

SUMMARY OF THE INVENTION

Accordingly, we have developed an architecture for programmable logic devices that includes BiCMOS circuits which are capable of operating at substantially greater speeds than prior art programmable logic devices. BiCMOS technology combines bipolar transistors and CMOS transistors in one device to gain the benefits of the speed of bipolar technology and the low power consumption of CMOS technology.

In one implementation of our invention, a routing structure is provided for a programmable logic circuit which includes logic cells in which logic functions are performed. The routing structure includes a set of input lines generally extending in a first direction for supplying signals to be processed by the logic cells, and a set of output lines extending in a different direction for receiving signals which have been processed by the logic cells. Where the input and output lines cross, junction regions are established which include controllable active driver circuits which are capable of programmably providing, or not providing, connections between selected ones of the set of output lines and selected ones of the set of input lines to enable signals present on the output lines to be placed on desired ones of the input lines. Each of the controllable driver circuits is a buffer circuit capable of being placed in at least an active state in which the driver circuit replicates a signal supplied to it, or in a passive state in which it presents a high impedance between its input and output. Typically, the controllable driver circuits enable each output line in the set to be connected to any desired ones in the set of input lines.

In another embodiment, our system includes a similar structure to that described immediately above, but in addition provides a set of controllable driver circuits to selectively interconnect desired ones of the input lines and the output lines to the logic cells. In this manner, input signals present on the input lines can be supplied to the appropriate nodes of the logic cell, and output signals from the logic cells can be supplied to other desired logic cells or other circuitry.

In conjunction with our system, controllable driver circuits may also be employed in the interface circuit between the integrated circuit pins and the sets of input and output lines. The controllable driver circuits allow desired connections between the pins of the integrated circuit and the input and output buses, thereby enabling desired signals presented at the chip pins to be supplied to appropriate logic cells, and the output from those logic cells to be applied to appropriate pins, as well.

The use of active circuits, such as the controllable driver circuit described herein, enables the programmable logic device of our system to operate substantially faster than prior art devices. Using 1993 semiconductor technology, in the prior art, 50 MHz represents an upper limit for the clock speed at which a programmable logic device can operate. Programmable logic devices fabricated using the techniques of our invention can operate at up to 500 MHz.

The logic cells in our invention may be programmed to perform various logic functions. Each logic cell provides high level logic, multiplexing and arithmetic functions. The cell can receive up to eighteen input signals and supply up to three output signals. The programmability is provided by the ability to control the polarity of each input signal, allowing each gate in the logic cell to receive the true or complement version of the original input signal.

The input stage to each logic cell contains an input driver, a polarity control circuit and a current driver. The input driver is a bipolar ECL gate with outputs that provide both true and complement versions of the input signal to the polarity control circuit. The polarity control circuit is a CMOS multiplexer that may be programmed to select either the true or the complement of the input signal provided to the ECL buffer. Circuit speed is maximized by use of the ECL buffer, while power consumption is minimized by use of the CMOS multiplexer. Power consumption is further controlled by the ability to shut down the current source that drives the output when the polarity control circuit is not in use, in contrast to standard ECL technology, so that the circuit does not draw any power when idle.

The invention will be better understood by reference to the following detailed description in connection with the accompanying drawings.

DETAILED DESCRIPTION OF THE DRAWINGS

Figure 1:
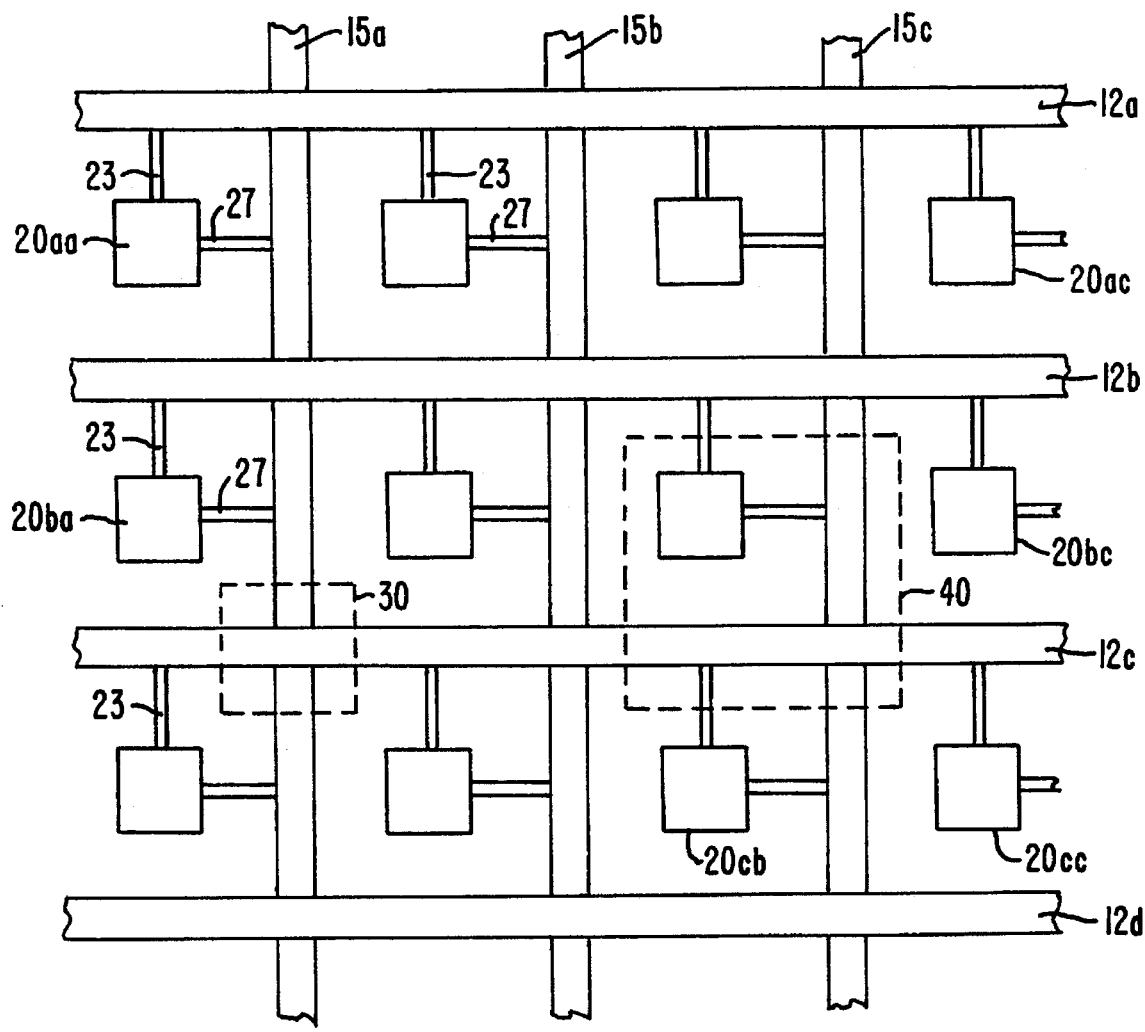
FIG. 1 is a block diagram illustrating the overall layout of a high speed programmable logic device fabricated according to a preferred embodiment of our invention.

FIG. 1 is a block diagram illustrating the overall layout of a high speed programmable logic device fabricated according to a preferred embodiment of our invention. As shown in FIG. 1, the device includes a first set of routing channels 12 disposed generally in an east/west orientation, a second set of routing channels 15 disposed generally in a north/south orientation, and a series of logic cells 20 disposed within the matrix of routing channels.

In the conventional manner of programmable logic device operation, the routing channels contain buses of conductors for supplying input signals to the logic cells, and receiving output signals therefrom. Often, the output signals from a logic cell are used as the input signals to another logic cell.

As is well known, each logic cell can perform any desired logical operation, either combinatorial or sequential, or both, upon the input signals supplied to it. The particular logic function performed by a logic cell depends upon its program state, which is typically "loaded" into the cell using external circuitry. The state is defined using control bits from the external apparatus to set multiplexers, flip-flops, gates, etc.

In the general block diagram of FIG. 1, the logic cells 20 receive input signals from buses 12, and supply output signals onto the buses 15. The input signals are transmitted from the bus and supplied to the logic cell by conductors 23, and the resulting output signals are supplied to the output buses 15 using conductors 27. As will be explained, these conductors themselves are programmable in the sense that the input nodes of the logic cells may either be connected to, or disconnected from, selected lines in the input data bus 12. Of course, as mentioned, the input data bus itself may carry as signals output information from other logic cells.

Connections between the input and output data buses may be made in location 30, where these buses cross each other. Although the buses are depicted as crossing each other in the drawing of FIG. 1, in actual practice they are formed using different levels of metal or other conductive material on an integrated circuit, and are electrically isolated from each other unless an electrical connection between them has been "programmed." The manner in which the conductors may be coupled to each other in the crossing regions 30 is described further below.

An advantage of the structure of our invention is that it is modular. As shown within dashed line 40, in the preferred embodiment of our invention, essentially all of the integrated circuit area is consumed using regular modules 40 which include the interconnecting buses 12 and 15, the logic cell 20, and the buses 23 and 27 to provide signals to, and receive signals from, the logic cell. This modular structure facilitates an efficient layout of the integrated circuit.

Thus, as shown, each output of a logic cell extends for the entire vertical span of the chip layout. The output buses extend along only one side of the logic cell, and stop at the chip edges. The input buses, however, "wrap-around" at the periphery of the integrated circuit. For example, buses 12a and 12b will be connected together at the east end or the west end of the circuit. In this manner, the input buses extend in a serpentine fashion across the surface of the entire circuit. Thus, bus 12a will be connected to bus 12b at either the eastern edge or the western edge of the chip, then bus 12b coupled to bus 12c at the opposite edge, etc.

The input and output buses are preferably unidirectional. For example, in an emitter coupled logic (ECL) implementation, or in a complementary MOS (CMOS) implementation, the buses will be unidirectional over the shortest segments, but can be made bidirectional in different segments of a common bus by isolating the segments from each other as will be described. Depending upon the length of the buses, the input/output signal strength, and other factors, it may be desirable to employ "repeaters" within the buses. These repeaters consist of small amplifiers to isolate the capacitances in the circuit, and thereby decrease signal propagation delays, enhancing overall system speed.

In one preferred embodiment, all buses 12, 15, 23 and 27 shown in FIG. 1 are structured to accommodate differential line driving. Each bus is actually made up of a complementary pair of lines carrying a differential signal pair, where one line carries the true signal and the other line carries the complement of the true signal. A complementary bus structure provides the advantage of being less susceptible to noise on the bus lines. If one wire picks up some noise, it is likely that the other wire will also pick up the same noise. Thus, since it is only the difference in voltages on the two bus lines which is the factor that determines the nature of the data signal, any noise effects are minimized. The low susceptibility to noise allows for an ECL circuit implementation in the PLD, where the signal range is relatively small, typically about 200 mV for differential signals and 500 mV for single-ended signals. ECL circuits offer significant speed advantages over other technologies, providing superior performance in the PLD.

Figure 2:
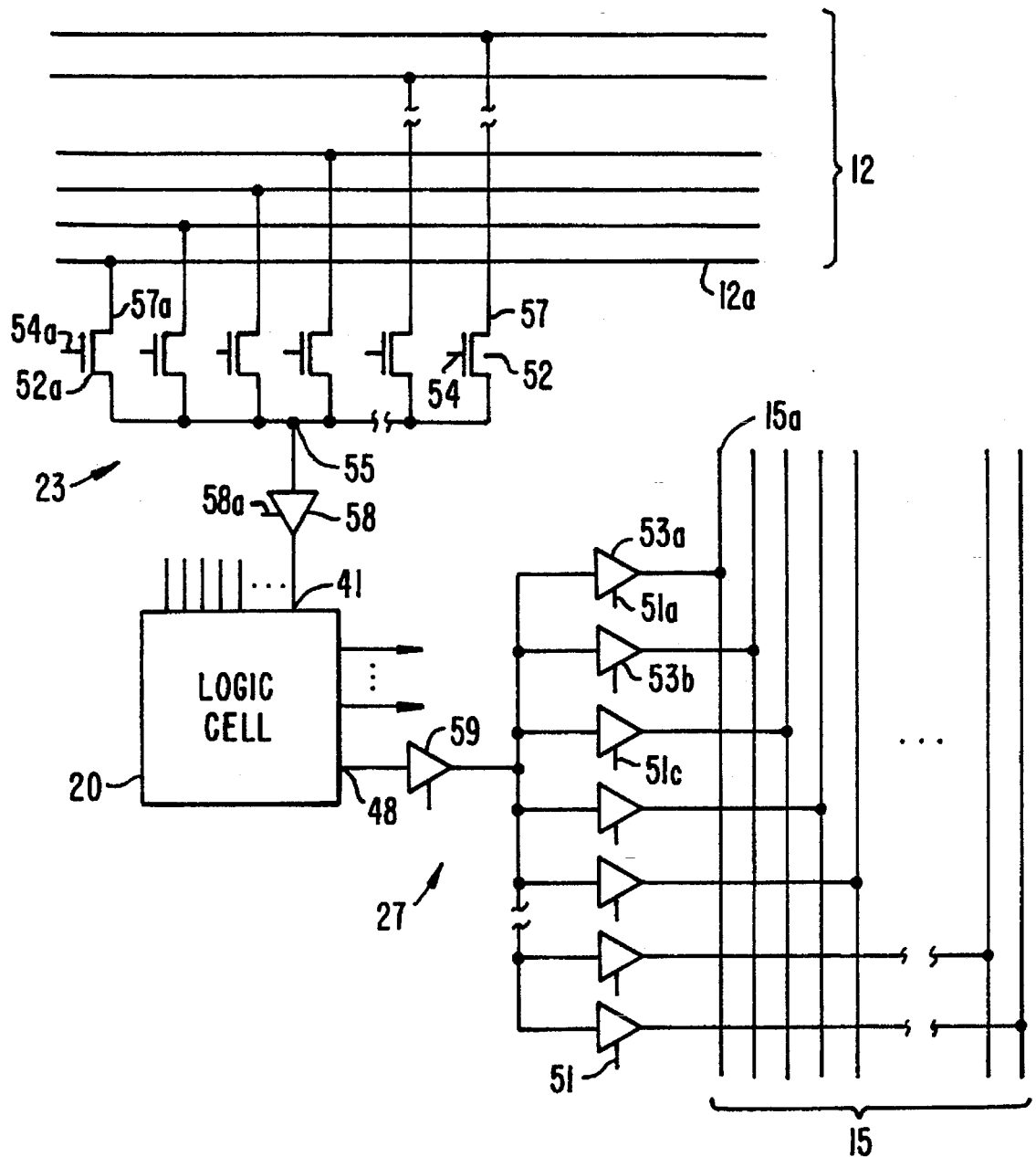
FIG. 2 is a schematic diagram illustrating the manner in which input signals are supplied to, and output signals are received from, the logic cell of our invention.

FIG. 2 is a more detailed view of the interconnection system between a logic cell 20 and its input bus 23, and between the logic cell 20 and its output bus 27. It should be appreciated that any desired number of inputs and outputs may be provided to and from a logic cell. The drawing in FIG. 2 illustrates the general approach to forming these interconnections and programmably controlling the connections.

As shown in FIG. 2, an input bus 12 has a series of conductors which may be selectively connected to an input node 41 of the logic cell using pass transistors 52 and a controllable driver circuit 58. Although the drawing depicts each conducting line in the bus 12 as being separately connectable to the input node 41, this is only for the purpose of illustration. In actual implementations of our circuit, each input node need not be connected to every line on the bus, as will become apparent in conjunction with a discussion of the fabrication of the logic cell below.

In any event, in the drawing each bus line in bus 12 is separately connected through a pass transistor and the driver circuit. Each pass transistor operates under control of an input signal supplied to it on line 54. Line 54 is coupled to a register or other means within which the program for controlling the overall programmable logic device is stored. A separate bit in this register, memory, a fuse or other means, is used to control a corresponding one of the programmable connections in the drawing in FIG. 2. Other bits are used to control other programmable connections elsewhere in the programmable logic device. Thus the control memory typically will have as many bits stored therein as there are programmable connections to be controlled. Of course, where two configurations are mutually exclusive and one, and only one, is always provided, the complementary state of a single bit can control two configurations. Under control of the memory bit, transistor 52a is either conducting or open. When the input 54a is enabled, transistor 52a transfers the signal coupled to its drain 57a. In other words, if a logical 1 is present on conductor 12a of bus 12, then drain 57a of transistor 52a will be a logical 1. Assuming that control line 54a is enabled, then the source of transistor 52a will also be a logical 1. Of course, the same conditions apply if a logical 0 is present on conductor 12a. Each of the pass transistors 52 functions in the same manner.

On the other hand, if control line 54 is not enabled, then the pass transistors functionally behave as an open circuit. In other words, node 55 is completely disconnected from bus 12. This allows an input node 41 to be disconnected from the bus 12 when that input node is not to receive signals from bus 12.

In some embodiments of our invention, a driver circuit 58 is provided between node 55 and node 41. The driver circuit functions as a programmable three state buffer operating under control of an input signal supplied to it on line 58a. Line 58a is also coupled to a register or other means within which the program for controlling the overall programmable logic device is stored. This additional circuit can be employed to help reduce the capacitive loading on the input node 41. Although not shown in FIG. 2, each of the other input nodes to the logic cell 20 is similarly coupled to the input signal bus 12.

The output signal bus 15 is coupled to the logic cell 20 using a similar technique. As shown, the logic cell provides an output node 48 which is supplied to an optional driver circuit 59. Circuit 59 is provided for the same reasons as circuit 58, that is, to reduce the capacitive loading and drive circuit requirements on the logic cell. For logic cells with output drive power sufficient to drive a large capacitance, driver circuit 59 is unnecessary.

The output from circuit 59 is coupled to the input of driver circuits 53, each of which operates under program control using information supplied on a corresponding line 51. Line 51 may be connected to a single shift register element, memory cell or other storage. Controllable driver circuits 53 function in the same manner as circuits 52, that is, they either drive the corresponding output bus line with the signal presented at their input node, or present a high impedance condition to the output bus. In the high impedance state, signals supplied by the logic cell are prevented from influencing the state of the particular bus conductor. Thus, the overall output connections 27 (as shown in FIG. 1) are the reverse of the input connections 23 (shown in FIG. 1).

In another embodiment of this invention, the circuits 52, 53, 58, and 59 can be replaced with multiplexers. In this case the control lines 51 and 54 supply control signals to select among the multiplexer input lines, connecting the appropriate one to the logic cell.

Figure 3:
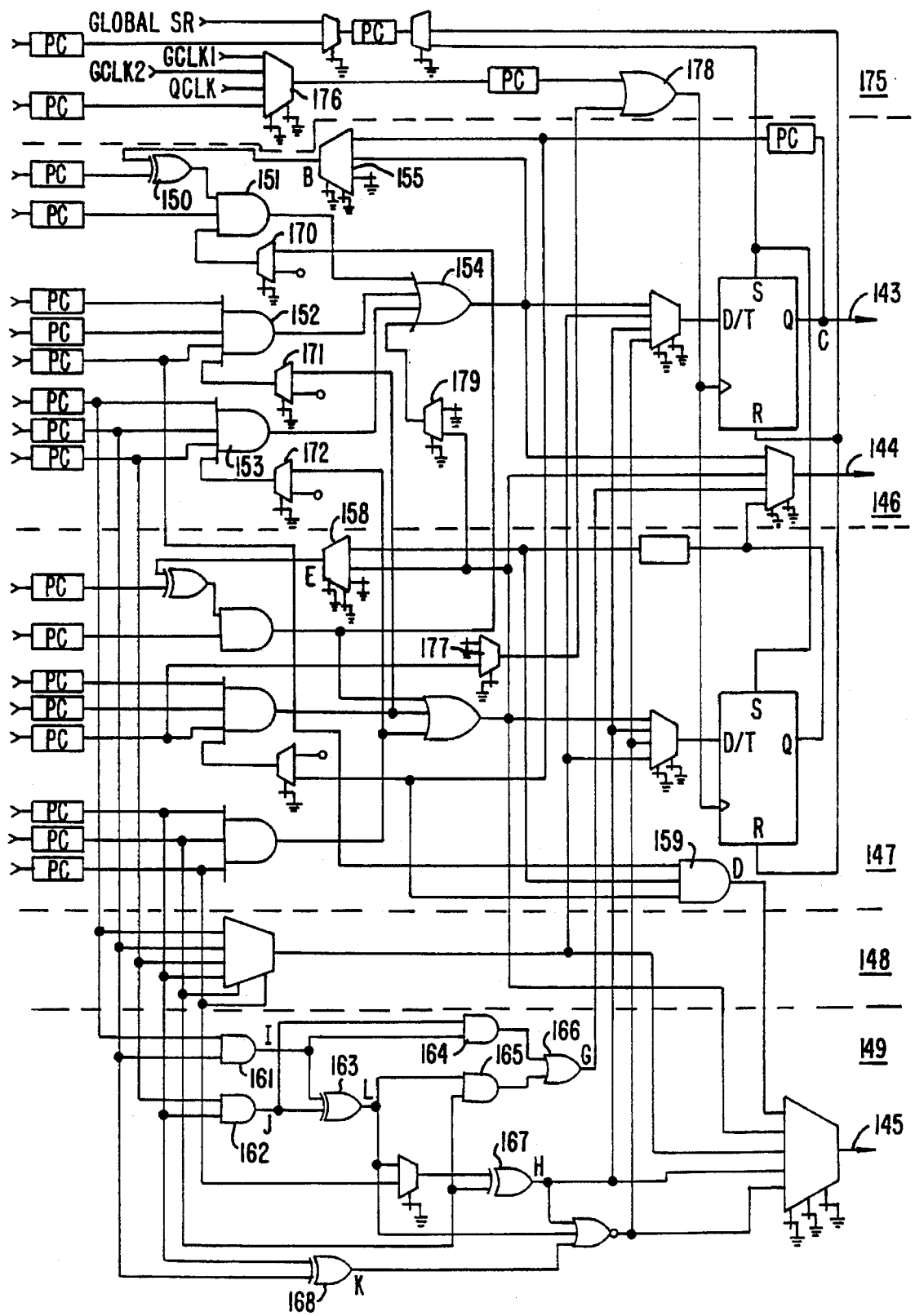
FIG. 3 is a detailed circuit schematic of a preferred embodiment of the logic block employed in the programmable logic architecture of this invention.

FIG. 3 is a detailed circuit schematic of a preferred embodiment of the logic block employed in the programmable logic architecture of this invention. The logic block schematic corresponds to a preferred embodiment of the logic block 20 shown in block diagram form in FIG. 1. Generally, depending on the programming, the logic block is coupled to receive up to eighteen input signals at the terminals along the left edge of the figure. In response the logic block supplies up to three output signals at the terminals 143, 144, and 145 along the right edge of the figure. For the purpose of explanation, the logic block can be considered as being divided into five sections as shown by the dashed lines extending across FIG. 3. The uppermost section 175 provides the clock and set/reset signals to the logic block. Sections 146 and 147 provide high level functions, as described below. The third section 148 provides a multiplexing function, and the bottom section 149 an arithmetic and comparing function. The bottom section adder can provide a carry to the top section, or permit the comparison of three bits to detect whether all are the same.

In the upper section 175, the clock and set/reset signals are input to the logic block. Multiplexer 176 selects among four possible clock inputs to the registers in the logic block.

In section 146, logic gates 151, 152, 153, and 154 provide AND-OR logic to node A. Feedback from some of the gates in section 147 is permitted by the multiplexers 170, 171, 172. This enables supplying of some of the input signals directed to section 147 to section 146, as well. Multiplexer 155 provides a feedback multiplexer, enabling, in combination with gate 156, a latch function to be provided. The feedback path from flip-flop 157 provides a load function for a counter or a shifter. The flip-flop itself provides a path for controlling data flow from the logic block to external circuitry. When the flip-flop is configured as a D-type flip-flop, it provides for shifting. When configured as a T-type flip-flop, it provides counting capability.

Section 147 of the logic block duplicates the functionality of section 146 above it and is linked to the upper sections at several locations in the logic block. For example, multiplexer 177 allows the gating of a selected clock in section 175 through OR gate 178. Also, the AND gate outputs in section 147 can be coupled through multiplexer 179 as an input to the OR gate 154 in section 146, creating an overall AND-OR logic block with a larger fan-in than one of the two sections 146 or 147 by itself. By programmably coupling sections 146 and 147 of the logic block together, the overall logic block can also provide a two-bit counter. This counter can be chained together with other counters provided by other logic blocks to make long counters. The connection at node C allows the upper unit to shift data to the lower unit.

Section 148 of the logic block, consisting primarily of multiplexer 160, can be programmed to provide a straight multiplexing function on a subset of the input signals without any of the delay associated with passing those signals through the combinational logic.

In the lower section 149 of the logic block, gates 161, 162, 163, 164, 165, 166, and 167 enable provision of a full adder with a carry bit at node G. The sum appears at node H. Gates 161 and 162 allow multiplexing, while gates 163, 168, and 167 allow comparison of three-bit quantities. Throughout FIG. 3 small rectangles labeled PC provide polarity control on the signal. Also, as shown, each multiplexer in the logic block is connected to be controlled by programmed control bits. The selected line is coupled to the output terminal of the multiplexer.

The logic block shown in FIG. 3 enables relatively easy construction of a set of logic functions. In contrast to the approach followed by other programmable logic device architectures, this architecture is optimized to provide various functions, rather than provide overall complete flexibility and functionality. By providing a relatively large logic block, fewer connections are required and faster overall operating speed is provided. In other architectures, the provision of numerous small logic blocks results in many interconnections among blocks, slowing overall system speed.

Figure 4:
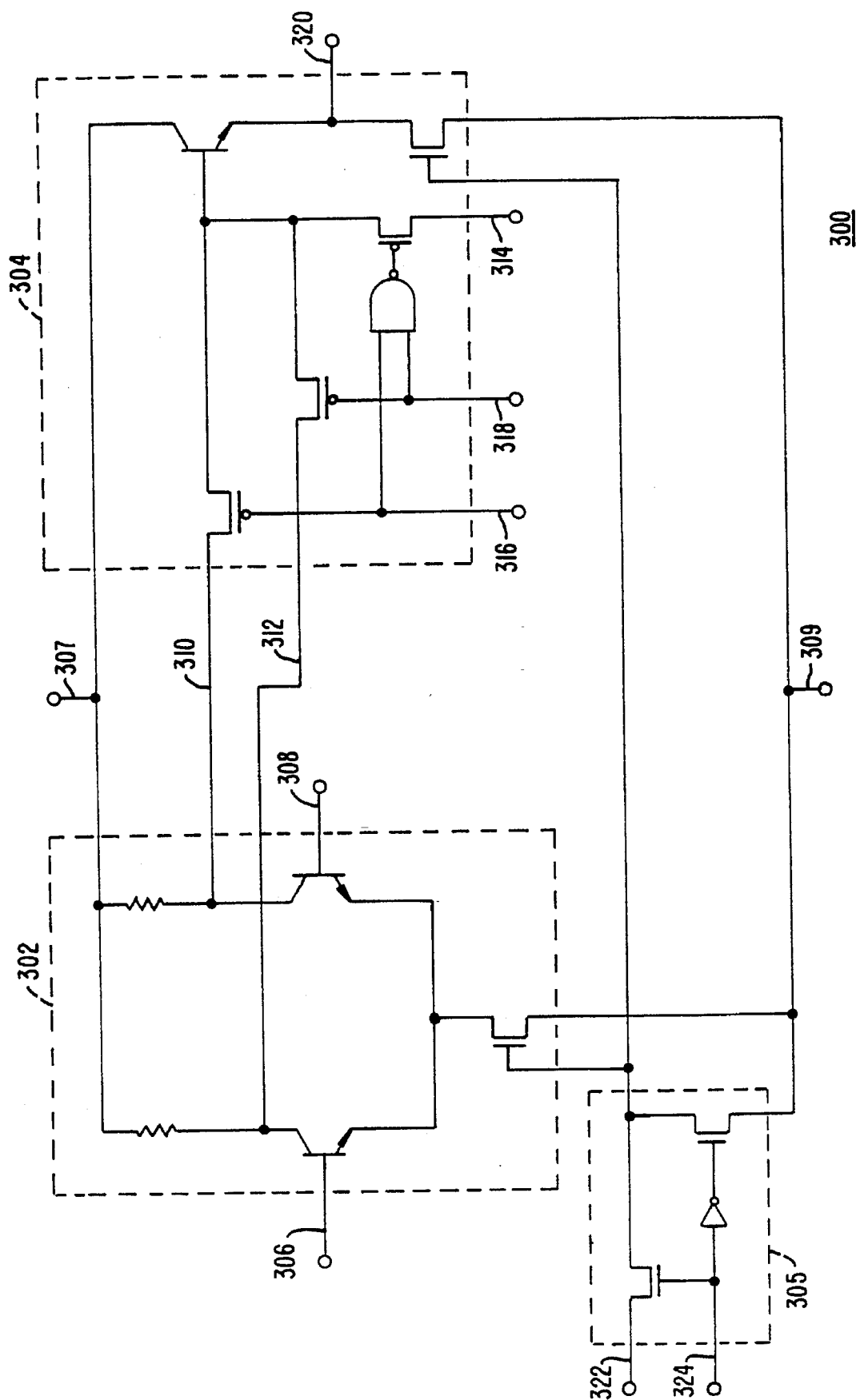
FIG. 4 is a detailed circuit schematic of a preferred embodiment of the input stage to a logic block.

FIG. 4 is a detailed circuit schematic of a preferred embodiment of the input stage of a logic block of this invention. The logic block input stage includes the controllable driver circuits in FIG. 2 as well as the polarity control blocks shown in FIG. 3.

Input stage circuit 300 includes a controllable input driver 302, a polarity control circuit 304, current source 305, first voltage source 307 and second voltage source 309. Input driver 302 is an ECL gate that provides speed advantages over other technologies. In the embodiment shown, input driver 302 is an ECL buffer with inputs 306 and 308. If a single-ended bus structure is used, the input signal is received on input 306 and a reference voltage $V_r$ is received on input 308. Of course, input stage circuit 300 may also be implemented with complementary bus lines, in which case the true bus will be coupled to input 306 and the complement bus to input 308. The ECL gate in input driver 302 operates in a known fashion. Consequently, the true version of the signal at input 306 is transferred on line 310 to the output stage, while the complementary version of the input signal is transferred on line 312.

Polarity control circuit 304 in the embodiment shown is a CMOS multiplexer, used for its limited power consumption, having three data inputs and one output. Two of the inputs are the true and complement signals on lines 310 and 312, respectively, from input driver 302, and a third input is a reference voltage on line 314. The multiplexing function is controlled by select lines 316 and 318. In the figure, if select line 316 is LOW and select line 318 is HIGH, the true version of the input signal will be supplied at output 320 by input stage circuit 300. Similarly, if select line 316 is HIGH and select line 318 is LOW, the complement version of the input signal will be supplied at output 320 by input stage circuit 300. If neither the true nor the complement input signal is desired, both select lines 316 and 318 can be set HIGH, which allows the reference voltage on line 314 to be output by input stage circuit 300. This capability is useful if, for example, the polarity control circuit output 320 drives a three-input AND gate that the user desires to implement as a two-input gate instead. By setting the reference voltage on line 314 to an appropriate level, the polarity control circuit output signal 320 will always be HIGH, allowing the AND gate output at the successive stage in the logic chain to be controlled only by its remaining two inputs. The programming software must be designed to avoid the condition where both select lines 316 and 318 are set LOW, as this would lead to bus contention.

In another embodiment, where there is no reference voltage 314, only one select input line, either 316 or 318 is needed. Rather than including a second select input, an inverter may be implemented between the select input coupled to the gate of one of the transistors and the gate of the other transistor. This would mean that one of the two signals on lines 310 and 312 will always be selected and output on output line 320. This embodiment is a simplified version of polarity control circuit 304 shown in FIG. 4 that would accordingly occupy less space on the chip die.

Current source 305 receives an input voltage 322 and a control input 324. If control input 324 is HIGH, the input voltage 322 is coupled to input stage circuit 300 and current source 305 drives the ECL input driver 302 and CMOS polarity control circuit 304. However, if the circuit is idle, control input 324 may be set LOW, decoupling the current source 305 from the rest of the circuit. Power consumption is further controlled by this capability to shut down the current source because, in contrast to standard ECL technology, the circuit does not draw any power when idle.

Figure 5A:
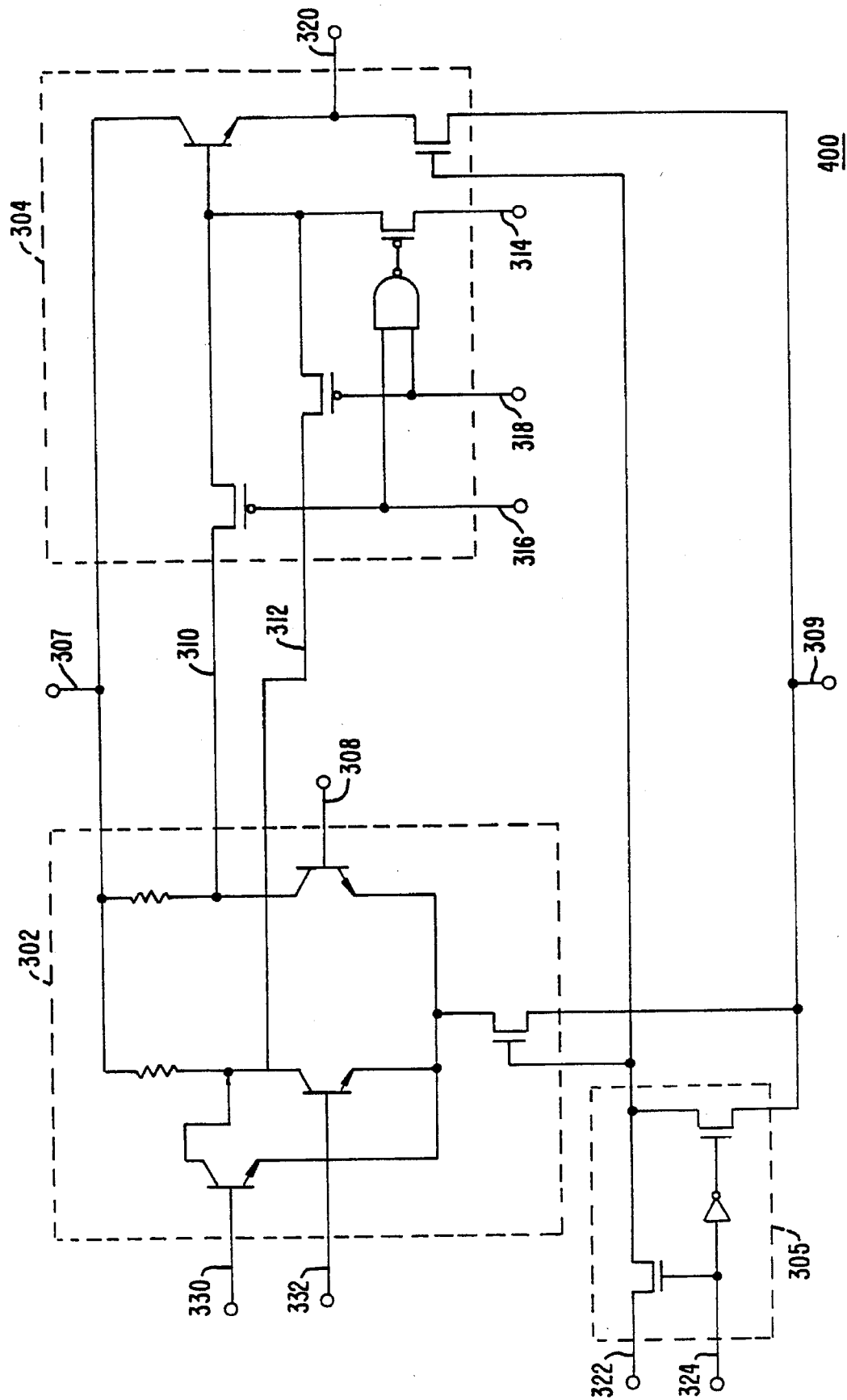
FIG. 5A is a detailed circuit schematic of a preferred embodiment of the input stage to a logic block including an OR gate at the buffer input.
Figure 5B:
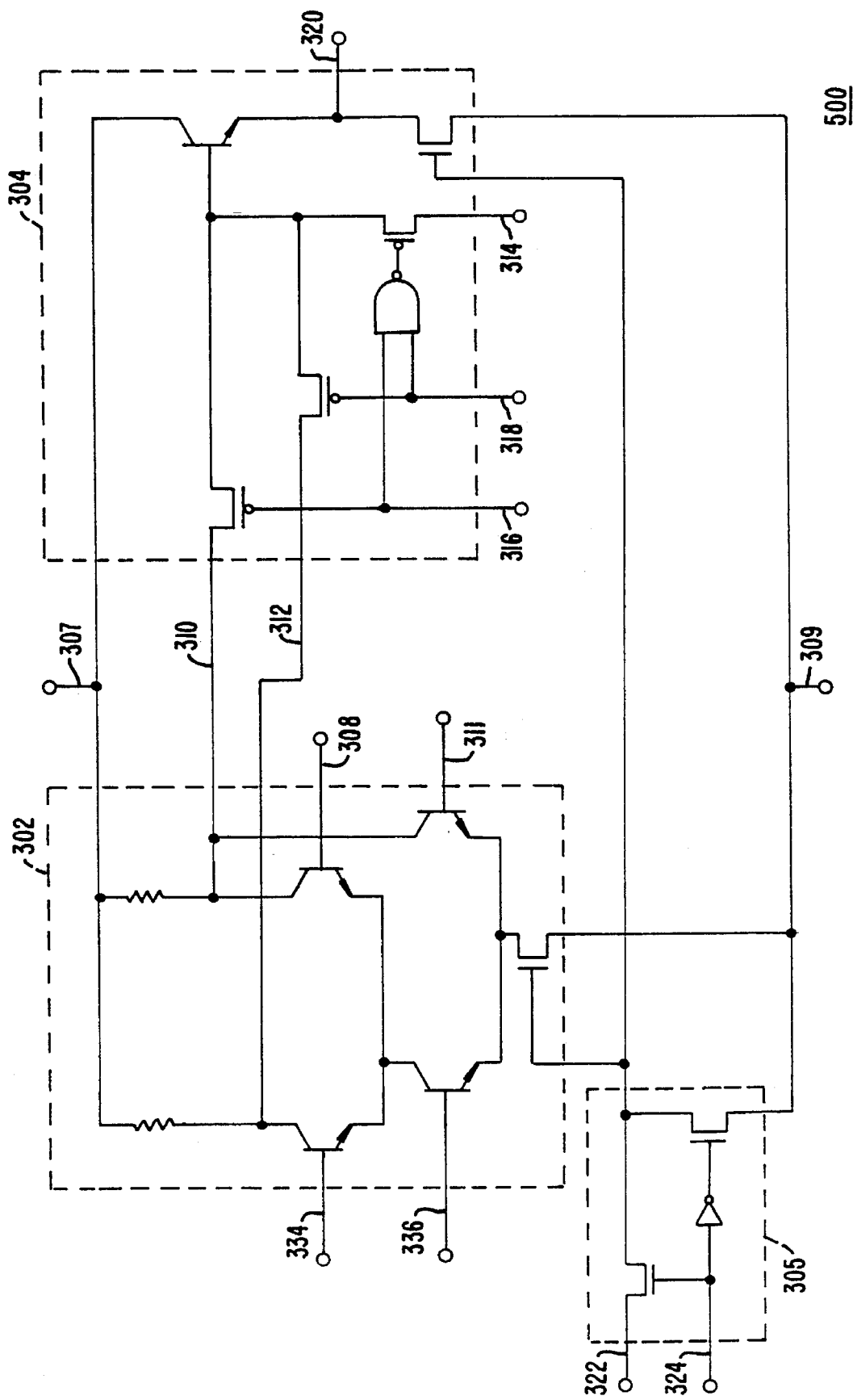
FIG. 5B is a detailed circuit schematic of a preferred embodiment of the input stage to a logic block including an AND gate at the buffer input.

In another embodiment, the input stage of the logic block is designed to perform any one of a variety of logic functions, as shown in FIGS. 5A and 5B. FIG. 5A shows an input stage circuit 400 where the input to driver circuit 302 is a two-input OR gate, with data inputs 330 and 332. FIG. 5B shows an input stage circuit 500 where the input to driver circuit 302 is a two-input AND function, with a second reference voltage input 311 and data inputs 334 and 336. Each gate could of course have additional inputs. The key feature is that the input stage includes bipolar elements for speed advantages, where the current source can be selectively disabled for decreased power consumption. Then, regardless of which function is placed at the input to the input driver circuit, the polarity control circuit 304 includes CMOS technology, again for decreased power consumption, to provide either the true or complement signal from the ECL input from input driver 302. This flexibility helps to achieve different programmable logic functions in the PLD logic block by allowing the user to control the polarity of the inputs to the AND-OR plane in the logic block.

Figure 6:
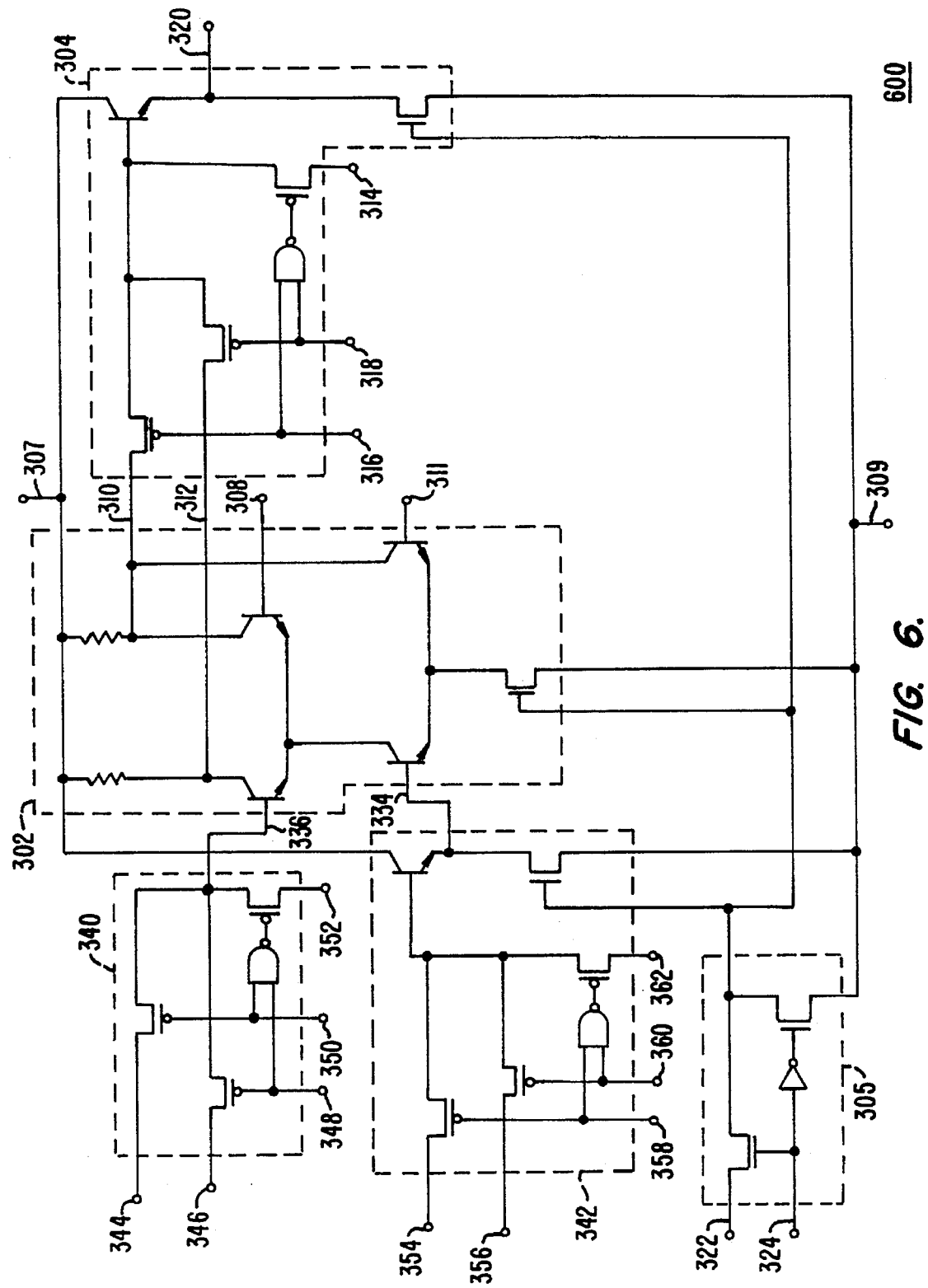
FIG. 6 is a detailed circuit schematic of a preferred embodiment of the input stage to a logic block including multiplexers at the buffer input.

In yet another embodiment, ECL buffer 302 may have at its inputs one or more CMOS multiplexers, similar to the multiplexer shown in polarity control circuit 304 of FIG. 3. FIG. 6 shows an input stage circuit 600 where the ECL input driver 302 is a two-input AND function, just as shown in FIG. 5B, but where buffer inputs 334 and 336 are outputs from multiplexers 340 and 342, respectively. Multiplexer 340 has data inputs 344 and 346 and select inputs 348, 350 and 352. Multiplexer 342 has data inputs 354 and 356 and select inputs 358, 360 and 362. Each multiplexer 340 and 342 operates in the fashion described above in conjunction with polarity control circuit 304. The presence of these multiplexers at the input to ECL input driver 302 allows the user to select among several signals that might be passed through input stage circuit 300. Thus, rather than requiring numerous additional polarity control circuits to handle additional input signals, the embodiment of FIG. 6 allows a high degree of flexibility with minimal additional hardware. Multiplexers can be used at the inputs to ECL gate 302, regardless of the logic function implemented by the gate.

The invention has now been explained with reference to specific embodiments. Other embodiments will be apparent to those of ordinary skill in the art upon reference to the present description. It is therefore not intended that this invention be limited, except as indicated by the appended claims.

What is claimed is:

1. A signal conditioning circuit having an input terminal and an output terminal comprising:

an input amplifying stage coupled to the input terminal for receiving an input signal and for providing a true and a complement version of said input signal;

a polarity control circuit having a first switch transistor coupling said true version of said input signal to a polarity control circuit output and a second switch transistor coupling said complement version of said input signal to said polarity control circuit output;

a third switch transistor coupling a reference voltage to said polarity control circuit output; and an output stage having an input coupled to said polarity control circuit output and an output coupled to the output terminal of the signal conditioning circuit.

2. The signal conditioning circuit of claim 1 further comprising:

a first current source coupled to said input amplifying stage;

a second current source coupled to said output stage; and a control circuit for selectively disabling said first current source and said second current source in a powersaving mode.

3. The signal conditioning circuit of claim 2 wherein said control circuit further comprises:

an input terminal for receiving an input voltage; and a control terminal for receiving a control signal, wherein said control signal selectively disables said first current source and said second current source in said powersaving mode.

4. The signal conditioning circuit of claim 1 wherein said input amplifying stage further comprises an emitter-coupled logic (ECL) buffer.

5. The signal conditioning circuit of claim 4 wherein said input amplifying stage further comprises an ECL buffer coupled to a complementary line pair carrying differential signals.

6. The signal conditioning circuit of claim 4 wherein said input amplifying stage further comprises an OR gate having at least two signal inputs.

7. The signal conditioning circuit of claim 4 wherein said input amplifying stage further comprises an AND gate having at least two signal inputs.

8. The signal conditioning circuit of claim 1 wherein said first, second and third switch transistors comprise MOS transistors.

9. The signal conditioning circuit of claim 4 further comprising a multiplexer block having a plurality of input terminals and an output terminal coupled to said input amplifying stage, said multiplexer block providing said input signal to said input amplifying stage.

10. The signal conditioning circuit of claim 9 wherein said multiplexer block further comprises:

a first switch transistor coupling a first input signal to said multiplexer block to said output terminal of said multiplexer block;

a second switch transistor coupling a second input signal to said multiplexer block to said output terminal of said multiplexer block; and a third switch transistor coupling a reference voltage to said multiplexer block to said output terminal of said multiplexer block.

11. A programmable logic device including the signal conditioning circuit recited in claim 1.

12. A signal conditioning circuit having an input terminal and an output terminal comprising:

an input amplifying stage coupled to the input terminal for receiving an input signal and for providing a true and a complement version of said input signal;

a polarity control circuit coupled to said true and complement versions of the input signal and to a control signal, said control signal selecting one of said true and complement versions of the input signal as an output of said polarity control circuit;

a switch transistor coupling a reference voltage to said output of said polarity control circuit; and an output stage having an input coupled to said polarity control circuit output and an output coupled to the output terminal of the signal conditioning circuit, wherein said polarity control circuit provides at the output terminal of the signal conditioning circuit either the true version of the input signal, the complement version of the input signal or said reference voltage in response to said control signal.

13. The signal conditioning circuit of claim 12 further comprising:

a first current source coupled to said input amplifying stage;

a second current source coupled to said polarity control circuit; and a control circuit for selectively disabling said first current source and said second current source in a powersaving mode.

14. The signal conditioning circuit of claim 13 wherein said control circuit further comprises:

an input terminal for receiving an input voltage; and a control terminal for receiving a control signal, wherein said control signal selectively disables said first current source and said second current source in said powersaving mode.

15. The signal conditioning circuit of claim 12 wherein said input amplifying stage further comprises an emitter-coupled logic (ECL) buffer.

16. The signal conditioning circuit of claim 15 wherein said input amplifying stage further comprises an ECL buffer coupled to a complementary line pair carrying differential signals.

17. The signal conditioning circuit of claim 12 wherein said polarity control circuit comprises MOS transistors.

18. A programmable logic device including the signal conditioning circuit recited in claim 12.

* * * * *